United States Patent
Sarda

(10) Patent No.: US 11,392,166 B2
(45) Date of Patent: Jul. 19, 2022

(54) CLOCK SKEW DETECTION AND MANAGEMENT

(71) Applicant: Silicon Laboratories Inc., Austin, TX (US)

(72) Inventor: Vivek Sarda, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 217 days.

(21) Appl. No.: 16/693,562

(22) Filed: Nov. 25, 2019

(65) Prior Publication Data

US 2021/0157356 A1    May 27, 2021

(51) Int. Cl.
| | |
|---|---|
| *G06F 1/12* | (2006.01) |
| *G06F 1/08* | (2006.01) |
| *H03K 5/156* | (2006.01) |
| *H03K 5/135* | (2006.01) |
| *G06F 1/10* | (2006.01) |

(52) U.S. Cl.
CPC ............... *G06F 1/12* (2013.01); *G06F 1/08* (2013.01); *G06F 1/10* (2013.01); *H03K 5/135* (2013.01); *H03K 5/1565* (2013.01)

(58) Field of Classification Search
CPC ..................................... G06F 1/12; G06F 1/08
See application file for complete search history.

(56) References Cited

U.S. PATENT DOCUMENTS

| | | | | |
|---|---|---|---|---|
| 2003/0002606 A1* | 1/2003 | Chen | ............. | H04L 7/0045 |
| | | | | 375/354 |
| 2004/0080671 A1* | 4/2004 | Siemens | ............. | H04N 21/4355 |
| | | | | 348/473 |
| 2004/0100310 A1* | 5/2004 | Kurakane | ............. | G06F 1/3203 |
| | | | | 327/114 |
| 2004/0225977 A1* | 11/2004 | Akkerman | ............. | G06F 30/33 |
| | | | | 716/108 |
| 2007/0071003 A1* | 3/2007 | Landolt | ............. | H04L 25/4908 |
| | | | | 370/389 |
| 2012/0229184 A1* | 9/2012 | Lin | ............. | H04L 7/033 |
| | | | | 327/144 |
| 2013/0082784 A1* | 4/2013 | Chiu | ............. | H03L 7/097 |
| | | | | 331/44 |
| 2017/0214405 A1* | 7/2017 | Yang | ............. | G06F 1/06 |
| 2018/0059159 A1* | 3/2018 | Hsu | ............. | H03K 5/22 |
| 2019/0007053 A1* | 1/2019 | Hailu | ............. | H03M 9/00 |

* cited by examiner

*Primary Examiner* — Phil K Nguyen
(74) *Attorney, Agent, or Firm* — Zagorin Cave LLP

(57) ABSTRACT

A system receives a first clock signal with a first frequency and a second clock signal having a second frequency lower than the first frequency. The system generates a new second clock signal aligned with the first clock signal based on a known phase/frequency relationship between the clock signals. A counter counts cycles of the first clock signal. The system generates a new second clock signal with an edge aligned with a first clock signal when the counter reaches a predetermined count value and the system resets the counter. A window opens that includes a time period when the edge of the first clock signal is expected. If an edge of the first clock signal is detected outside of the window, the counter is reset responsive to the detected edge.

19 Claims, 4 Drawing Sheets

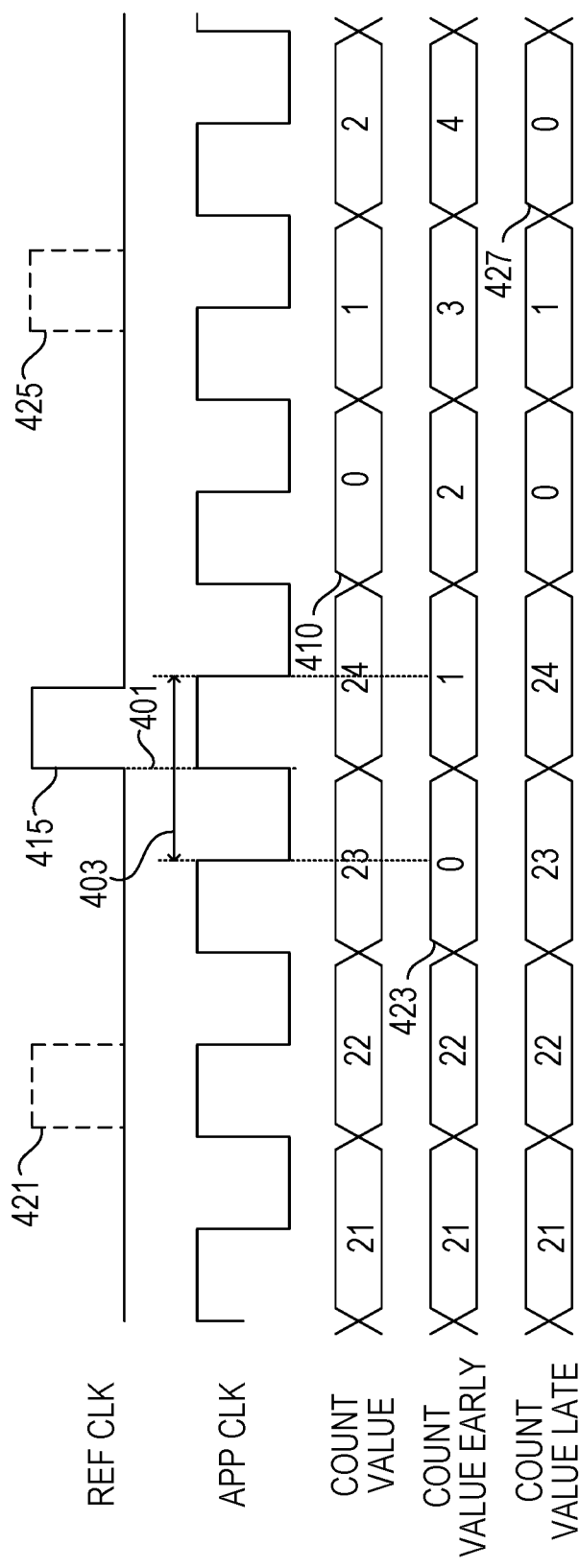
FIG. 4A
FIG. 4B
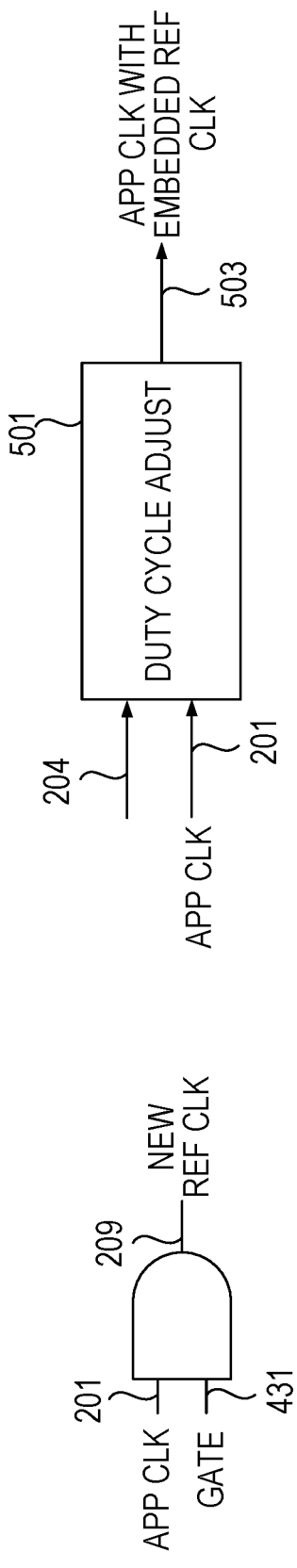
FIG. 5

CLOCK SKEW DETECTION AND MANAGEMENT

BACKGROUND

Field of the Invention

This application relates to addressing clock skew in systems.

Description of the Related Art

Multiple clock signals are used in systems and are intended to have a known relationship so the clock signals can be reliably used by system components. Clock skew develops between the multiple clock signals and one approach to deal with clock skew has been to regenerate one of the clock signals using a phase-locked loop (PLL). However, that can cause an increase in power and area that can be undesirable in certain systems.

SUMMARY OF EMBODIMENTS OF THE INVENTION

Accordingly, in order to address clock skew, one embodiment provides a method that includes receiving a first clock signal with a first frequency and a second clock signal with a second frequency, the first frequency being higher than the second frequency. A counter is clocked with the first clock signal and a new second clock signal is generated with a new second clock signal pulse aligned with the first clock signal responsive to the counter counting to a predetermined count value.

In another embodiment, an apparatus includes a counter coupled to receive a first clock signal and to count a predetermined count value of first clock signal cycles. Update clock logic supplies a new second clock signal with a new second clock signal pulse having a new second clock signal edge aligned with a first clock edge of the first clock signal, the new second clock signal pulse being provided responsive to the counter reaching the predetermined count value. An edge detect circuit detects an edge of a second clock signal. Window logic generates a time window and determine if the edge of the second clock signal occurs within the window.

In another embodiment a method includes receiving a first clock signal and a second clock signal, the first clock signal having a higher frequency than the second clock signal. The method further includes counting cycles of the first clock signal in a counter and generating a new second clock signal having a new second clock signal pulse with a new second clock signal edge aligned with a first clock signal edge of the first clock signal. The generating of the new second clock signal pulse is responsive to the counter counting a predetermined number of cycles of the first clock signal.

BRIEF DESCRIPTION OF THE DRAWINGS

The present invention may be better understood, and its numerous objects, features, and advantages made apparent to those skilled in the art by referencing the accompanying drawings.

FIG. 4A illustrates a timing diagram showing the relationship of example REF clock and APP clock signals and the timing of generating a new REF clock signal.

FIG. 4B illustrates a clock gating circuit to generate the NEW REF clock signal.

FIG. 5 illustrates a high level block diagram showing the inputs and outputs of a duty cycle adjust circuit to adjust the duty cycle of the APP clock signal to embed the REF clock signal.

The use of the same reference symbols in different drawings indicates similar or identical items.

DETAILED DESCRIPTION

Figure 1:
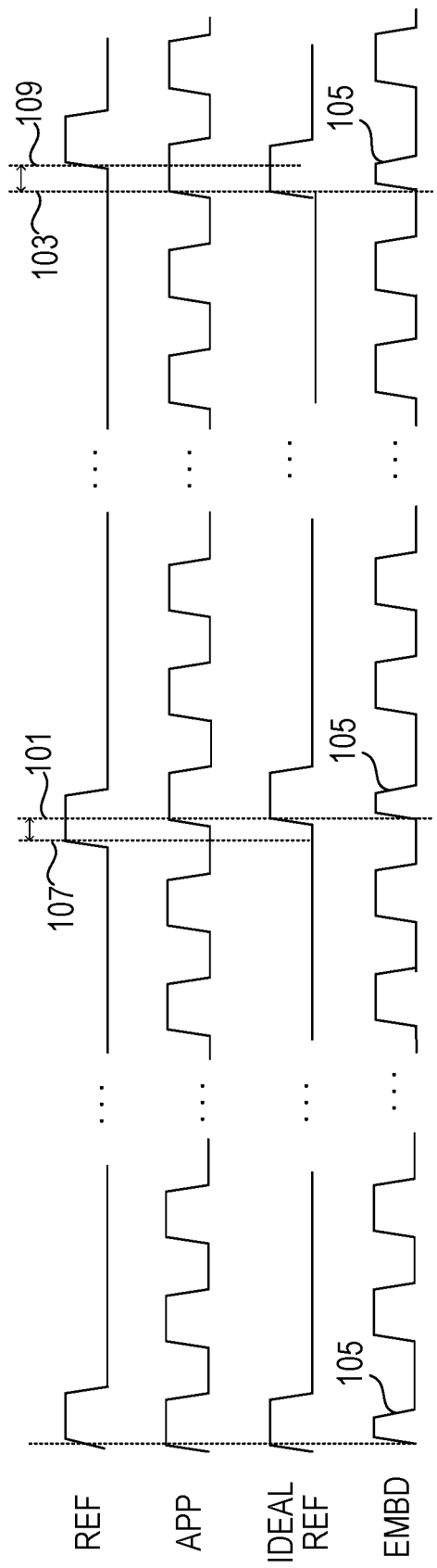
FIG. 1 shows a timing diagram of an example phase relationship between two plesiochronous or mesochronous signals.

Telecommunication systems typically have a pair of pseudo synchronous signals—a high frequency clock that travels with a lower frequency sync signal, which is the fundamental/base time beat, for example, a 1 pulse per second (PPS) signal for the whole system. Several terms describe characteristics of a pair of signals (or more than two signals). "Synchronous" refers to two or more signals that operate in unison with a shared base time interval. Plesiochronous is described by ITU-T standards as a pair of signals with the same "average" frequency but have a changing phase relationship. In a real world example plesiochronous signals can be, e.g., the same signals with variation in phase resulting from passing through different filtering functions. Another way to describe plesiochronous signals is a pair of signals as that occur at nominally the same rate, with any variation in rate being constrained within specified limits. Signals with the same frequency but unknown phase relationship are referred to as mesochronous. Mesochronous signals can be considered as a mismatch between signals from the same source but through different path delays. Some terms describe a single signal. An isochronous signal is a signal that modulates around an average frequency such that the modulation frequency is related to the fundamental frequency. Finally, a beat or frame between two signals is a common base frequency (highest common factor) between the pair of signals. For example, a first signal with a frequency of 156.25 MHz and a second signal with a frequency of 125 MHz have a common base frequency or beat of 31.25 MHz at which frequency the rising (or falling) edges of the first and second signal align.

Two synchronous or plesiochronous clock signals traveling together over long distances lose the phase relationship they have with each other by the time they reach a target destination due to such factors as mismatch in the paths and changes in temperature. These signals can be plesiochronous or mesochronous at the receiver having gone through different paths through the system via cabling, printed circuit board (PCB) traces, transformations into timestamps and/or having gone through other circuits that have different filtering coefficients/loop bandwidths. The pair of signals are used by such circuits as analog to digital converters (ADCs), digital to analog converters (DACs) and phase-locked loops (PLLs) and such circuits rely on the skew between the two signals to be constant and controlled. Thus, there is a need to remove the jitter and skew from the fundamental base time beat without using an extra PLL in the path to avoid the added power, space and cost of the extra PLL. At least one embodiment described herein realigns the clock signals to the required phase relationships without the use of a PLL. Even if a slower clock of the pair of clock signals is lost, embodiments are able to keep producing the slower clock signal using an estimated phase relationship between the pair of clock signals and keep the synchronous nature of the relationship with the estimated phase alignment.

Referring to FIG. 1, the timing diagram illustrates an example phase relationship between two plesiochronous or mesochronous signals, the REF clock signal and the APP clock signal. The REF clock signal is a lower frequency clock signal and the APP clock signal is a higher frequency clock signal. By way of example, the slower REF clock signal is between 1 Hz and 8 KHz and the faster APP clock signal is between 10 MHz and 125 MHz. FIG. 1 shows the ideal alignment between an IDEAL REF clock signal and the APP clock signal with the edges of APP clock and IDEAL REF clock having rising edges aligned at 101 and 103. Embodiments also contemplate embedding the slower clock signal into the faster clock signal by using a different duty cycle at 105 for the faster clock signal at a frequency of the REF clock signal. Instead of having an IDEAL REF clock, the relative edges of the two clock signals can be misaligned due to factors such as jitter and process, voltage, and temperature (PVT) variation of the paths of the two signals, which results in the REF clock signal leading or lagging the APP clock signal. For example, FIG. 1 illustrates the REF clock leading the rising edge of the APP clock at 107 and lagging the rising edge of the APP clock signal at 109. At least one embodiment of the invention regenerates the REF clock signal with the desired phase relationship with the APP clock signal. Once the ideal REF clock signal can be constructed, embedding the reference signal into the App signal (such as shown as the EMBD clock signal in FIG. 1) can also be done reliably. Thus, embodiments described herein can be utilized with embedded reference clock signal approaches such as embedded PPS (ePPS).

Figures 2, 3:
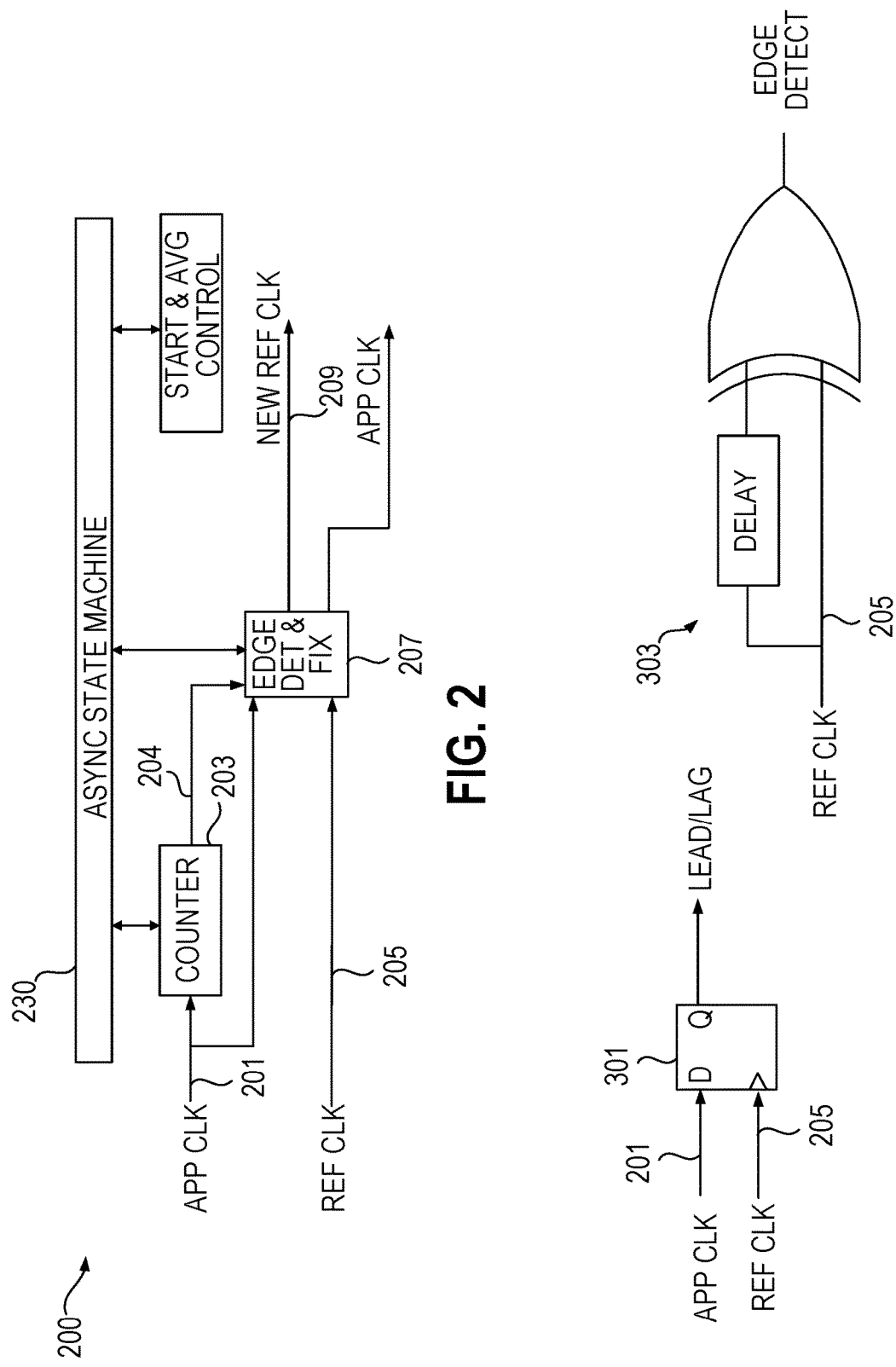
FIG. 2 illustrates a high level block diagram of a synchronizer that regenerates a slower (REF) clock signal to ensure the desired phase relationship with a faster (APP) clock signal.
FIG. 3 illustrates a sampling circuit and an edge detect circuit.

FIG. 2 illustrates a high level block diagram of a synchronizer 200 that regenerates the REF signal with the desired phase relationship with the APP clock signal. The APP clock signal 201 is received by the counter 203. The counter 203 counts the number of APP clock cycles. The APP clock signal 201 and the REF clock signal 205 are supplied to the edge detect and fix circuit 207. The edge detect and fix circuit 207 generates a new REF clock signal that lines up with the edge of APP clock as desired. The edge detect circuit samples the incoming APPCLK with the incoming REFCLK to determine a leading or lagging relationship between the two clock signals. That can be accomplished with an edge detect circuit such as shown in FIG. 3. A flip-flop type structure 301 samples the APP clock with the REF clock to determine if the respective edges of the two clock signals are leading or lagging. If the output of the flip-flop is a 0, the edge of REF clock is leading and if the output of the flip-flop is one, the edge of the REF clock is lagging the APP clock edge. Note that the sampling circuit should be designed to mitigate potential metastable states due to transitions of the APP clock violating setup and hold times of the flip-flop, e.g., by having multiple serially connected flip-flops. The leading and lagging information gives the system an indication of the delay mismatch between the two signals and it provides an indication of the stability of the mismatch. If the signal changes slowly from a lead to a lag or vice versa, that is an indication of modulation in the system due to external causes like temp stability, recovery bandwidth, etc. FIG. 3 also shows an edge detect circuit 303 that generates a pulse with each edge of the REF clock signal.

The count value 204 supplied by counter 203 determines when the NEW REF clock signal should occur. Referring to FIG. 4A, assume the rising edge of the NEW REF clock signal ideally occurs at the rising edge 401 at the start of the 24th clock cycle of the APP clock signal as counted by counter 203. Since some small misalignment can be expected between the two clock signals, a window 403 opens before the expected rising edge and closes the window after the expected rising edge. In an embodiment, the window opens a half cycle before the rising edge 401 and closes a half cycle after the rising edge 401 to allow for some amount of misalignment between the clock signals. Thus, e.g., based on the count value=23, the window opens on the negative edge of the APP clock and closes on the following negative edge of APP clock. Other window lengths can also be used. The control logic determines if the edge of REF CLK detected by the edge detect circuit occurs within the window 403. If the edge occurs within the window, then there is no error condition that needs fixing or reporting, the edge detect and fix circuit 207 supplies the NEW REF clock signal 209 (see FIG. 2) with a rising edge that is aligned with the rising edge 401 of the APP clock signal and the counter is reset to 0 or another desired value at 410 and begins counting again. In the example shown, the counter is reset to 0 but in other embodiments the counter may be reset to a different desired starting count value. FIG. 4B shows a simple clock gating circuit that can be used to generate the NEW REF clock signal aligned with the APP clock signal by gating through the APP clock signal as the new REF clock signal by asserting the GATE signal 431 to ensure a NEW REF clock pulse is generated at edge 401 of the APP clock. Thus, the gate signal 431 is asserted based on the counter values to gate through a pulse of the NEW REF clock signal. For example, the gate signal 431 may be asserted after the negative edge of APP clock during count 23 and deasserted after the negative edge of APP clock during count 24. Note that the pulse width of the NEW REF clock signal may be adjusted to be other than the pulse width of the APP clock signal to provide the desired duty cycle for the particular implementation.

If the edge of the REF clock signal does not occur within the window, then there are several scenarios that are possible. If the edge of REF clock does not occur before or during the window, the NEW REF clock signal 209 is generated with a rising edge of a clock pulse at the expected edge (the rising edge of the 24th count of counter 203 (shown as pulse 415) and the counter is reset (or reset to the desired count value) at 410 and the counter restarts its count. Thus, if the REF clock fails to arrive at its destination due to an upstream failure or other reason, the NEW REF clock signal can be reconstructed using the expected phase/frequency relationship with APP clock.

In another scenario, the edge of the REF clock signal is detected before the window, e.g., at 421 during the 22nd count of counter 203. In that case, a phase jam occurs to try and resynchronize the two clock signals and the counter is reset at 423 after the 22 count. In an embodiment, the NEW REF clock pulse at count=22 is skipped to avoid additional delay and/or complications associated with being able to supply a NEW REF clock pulse without a prior knowledge that it is coming early. The REF pulse does not occur again until the counter again reaches a count value of 24. Thus, the upcoming pulse expected at the original 24th cycle at 401 is skipped since the counter has already been reset.

Another scenario that occurs is the edge of REF clock being detected after the window. If the edge is detected after the window, e.g., at 425, the pulse 415 is generated as part of the new REF clock signal since no edge had been detected. However, since no edge was detected during the window, it can be assumed that there is an error condition of some sort. In some embodiments, that error is logged or reported according to system requirements. Assume the pulse is detected at 425 during cycle 1 of the counter. In that case, another phase jam occurs to try and align the two clock signals by resetting the counter at 427. The next REF clock signal should then occur when the counter again reaches the count value of 24 or a total of 26 cycles after the previous REF clock signal. Note that FIG. 4A shows the REF clock as occurring every 25 cycles of APP clock for ease of illustration. If the APP clock signal is 10 MHz and the REF clock signal is a 1 PPS signal (1 Hz), the count value at which the REF clock occurs will be much higher than 25 cycles. Thus, the counter is reset to zero or the desired counter initial value to keep the slower clock properly aligned with the faster clock signal with the assumption being that the faster clock signal is correct and the count value is used to predict the next edge of REF clock. Note that the duty cycle of the REF clock signal in FIG. 4A is shown to be very small, with a pulse width approximately equal to the pulse width of the APP clock signal, in embodiments the duty cycle of the REF clock signal is chosen to be a duty cycle appropriate for the system, e.g., ranging from very small as shown in FIG. 4, to a 50% duty cycle or greater in other embodiments.

Referring to FIG. 5, for an embodiment embedding the reference clock signal in the APP clock signal, the count value 204 and the APP clock signal 201 are supplied to a duty cycle adjust circuit 501 to adjust the duty cycle of the APP clock signal every 25 cycles (or other appropriate count value) of the APP clock signal and supply a new APP clock 503 in which the REF clock signal is embedded. In an embodiment supplying an embedded REF clock signal, the edge detect and fix circuit 207 is configured to detect whether the adjusted duty cycle occurs within the window and otherwise handles the reset of the counter as described with relation to FIG. 4. That is, the counter 203 is reset if the embedded REF clock occurs outside of the window (comes early or late). In addition, the duty cycle adjust circuit has to remove any adjusted duty cycles that occur outside of the window that were received in the APP clock signal.

In some embodiments, the REF clock signal 205 is supplied separately to synchronizing circuit 200 but the NEW REF clock signal 209 is embedded in the APP clock signal to downstream logic by adjusting the duty cycle at the frequency of the REF clock signal. In that case, assuming the timing of FIG. 4, the duty cycle is adjusted for the 24th cycle, instead of pulse 415. If the REF clock signal comes after the window, the pulse is embedded at the 24th cycle. As described above, the counter is reset responsive to the REF clock pulse occurring outside the window.

Referring again to FIG. 2, in an embodiment, the asynchronous state machine 230 does not require any clock and is used to control the startup gating and programming controls. For example, on startup the state machine 230 controls the NEW REF clock signal 209 to generate every N cycles of the APP clock, where N is an integer. In other embodiments, the state machine 230 may be a synchronous state machine using a locally generated or a received clock signal.

An embodiment utilizes an optional learning mode to determine the counter value at which the expected REF clock signal occurs. Thus, rather than being programmed with a number, e.g., 25, the maximum count value is calculated from REF CLK. For example, the number of APP clock cycles in a predetermined number of REF CLK periods is averaged to determine the number of APP clock signals in a REF clock period. If the number is a non-integer number, the number may be rounded to the closest integer number and used as the maximum count value at which the counter is reset to zero.

Figure 6:
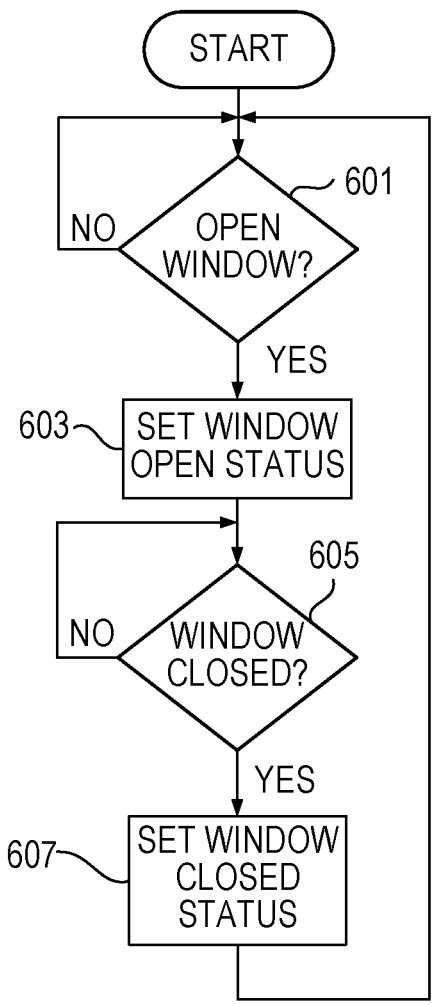
FIG. 6 shows a flow chart associated with control functionality of opening and closing of the window during which a transition of the REF clock signal is expected.
Figure 7:
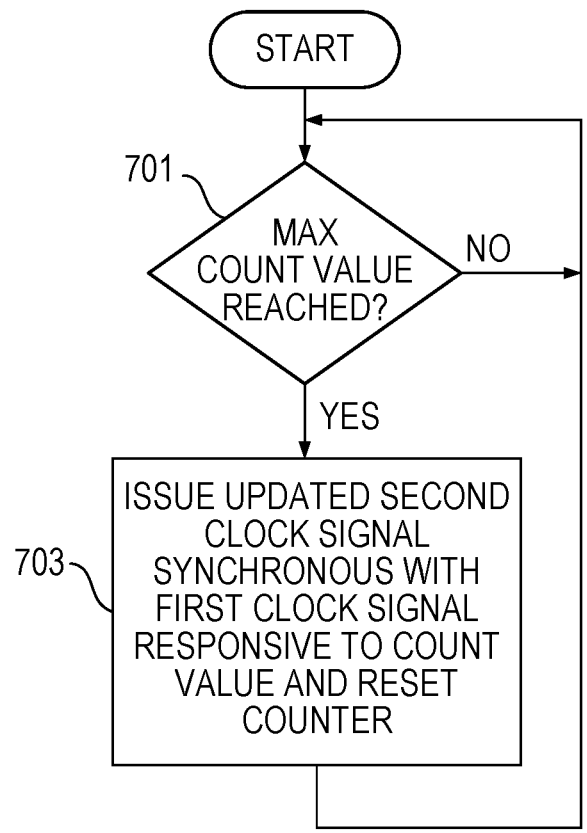
FIG. 7 shows a flow chart associated with control functionality of checking to see if the maximum count value is reached and generating a new REF clock signal.
Figure 8:
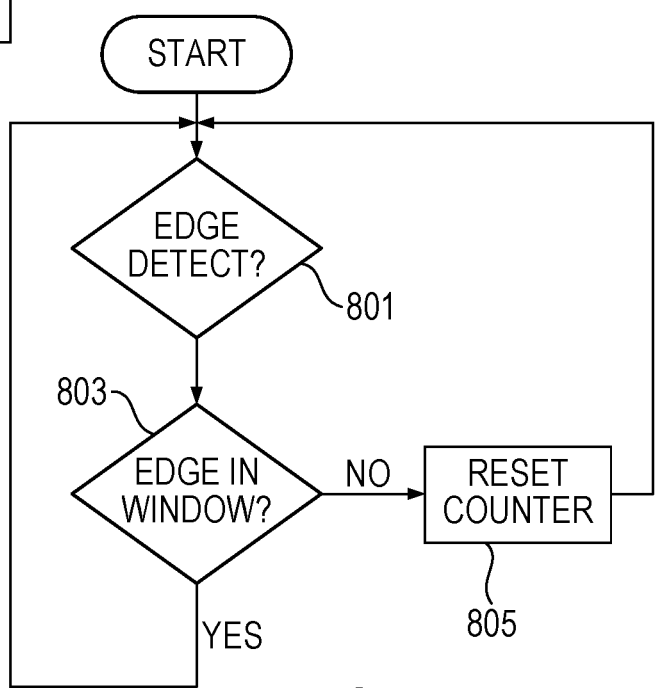
FIG. 8 shows a flow chart of control functionality associated with resetting the counter responsive to an edge of the REF clock signal being detected outside of the window.

FIGS. 6-8 illustrate various control flows of the synchronizer 200. FIG. 6 shows that the control logic checks to see if the window is open at 601 by looking for the falling edge when the count is 23. If that edge occurs, the window opens in 603 and the control logic sets a status bit indicating the window is open. The control logic in 605 checks for the closing of the window looking for, e.g., the negative edge of the 24th cycle, at which time the window closes in 607 and the window closed status is set. FIG. 7 illustrates the control logic checking to see if the maximum count value is reached in 701, e.g., count=24, and if so, the control logic in 703 supplies a NEW REF clock signal having an edge aligned to the edge of the faster clock signal (APP CLK) and resets the counter. As pointed out above, in an embodiment that is accomplished by asserting the gate signal 431 (see FIG. 4B). FIG. 8 illustrates control functionality associated with resetting the counter responsive to an edge detected outside of the window. If an edge is detected in 801, in 803 the control logic checks to see if the edge occurred within the window based on the window open or closed status. If the edge occurred outside the window (window closed) either before the window or after the window, the counter is reset in 805 to cause a phase jam to resynchronize the expected arrival of the slower clock signal.

Thus, a slower clock signal can be regenerated without the use of a PLL using an estimated phase/frequency relationship with a faster clock signal.

Thus, various approaches have been described to align two clock signals without the need for a PLL. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
   receiving a first clock signal with a first frequency and a second clock signal with a second frequency, the first frequency being higher than the second frequency;
   counting cycles of the first clock signal in a counter;
   determining a time window based, at least in part, on a predetermined count value of the counter;
   determining if a transition of the second clock signal occurs during the time window;
   resetting the counter responsive to the transition of the second clock signal occurring outside of the time window; and
   generating during the time window a new second clock signal with a new second clock signal pulse aligned with the first clock signal.

2. The method as recited in claim 1 wherein the second clock signal is embedded in the first clock signal as a change in duty cycle.

3. The method as recited in claim 1 wherein the new second clock signal pulse is embedded in an updated first clock signal as a change in duty cycle.

4. The method as recited in claim 1 further comprising:
resetting the counter responsive to the transition of the second clock signal occurring before the time window and supplying the new second clock signal pulse during a new window after the counter has counted the predetermined count value after the resetting.

5. The method as recited in claim 1 further comprising:
if the transition of the second clock signal does not occur before the time window, supplying the new second clock signal pulse during the time window;
resetting the counter responsive to the transition of the second clock signal occurring after the time window; and
issuing another new second clock signal pulse during a new time window determined at least in part by the counter counting to the predetermined count value after the resetting after the time window.

6. The method as recited in claim 1 further comprising:
determining an average of a number of first clock signals that occur in the second clock signal over multiple periods of the second clock signal; and
using the average to indicate when the transition of the second clock signal is expected to occur.

7. The method as recited in claim 1 further comprising resetting the counter responsive to the counter reaching a particular count value.

8. An apparatus comprising:
a counter coupled to count cycles of a first clock signal;
a window logic circuit to generate a time window based, at least in part, on a predetermined count value of the counter and to determine if an edge of a second clock signal occurs within the time window;
an update clock logic circuit to supply a new second clock signal with a new second clock signal pulse that is edge aligned with a first clock edge of the first clock signal, the new second clock signal pulse being supplied during the time window; and
wherein the counter is reset responsive to the edge of the second clock signal occurring outside of the time window.

9. The apparatus as recited in claim 8 wherein the time window includes a time period that contains the first clock edge of the first clock signal.

10. The apparatus as recited in claim 8 wherein the second clock signal is embedded in the first clock signal as a change in duty cycle of the first clock signal to indicate the second clock signal.

11. The apparatus as recited in claim 8 wherein the new second clock signal pulse is embedded in an updated first clock signal as a change in duty cycle.

12. The apparatus as recited in claim 8 wherein if the edge of the second clock signal comes before the time window, the counter is reset responsive to the edge of the second clock signal, and the new second clock signal pulse is issued edge aligned with the first clock signal edge during a new time window determined in part by the counter having counted to the predetermined count value.

13. The apparatus as recited in claim 8 wherein if the edge of the second clock signal does not come before the time window, the new second clock signal pulse is issued during the time window.

14. The apparatus as recited in claim 13 wherein the counter is reset responsive to detecting the edge of the second clock signal occurring after the time window.

15. The apparatus as recited in claim 8 further comprising:
averaging logic to determine an average of a number of first clock signals that occur in the second clock signal over multiple periods of the second clock signal; and
wherein the average is used to indicate when the edge of the second clock signal is expected to occur.

16. The apparatus as recited in claim 8 wherein the counter is reset responsive to the counter reaching a particular count value.

17. A method comprising:
receiving a first clock signal and a second clock signal, the first clock signal having a higher frequency than the second clock signal;
counting cycles of the first clock signal in a counter;
determining a time window based, at least in part, on a count value of the counter;
determining if an edge of the second clock signal is received during the time window;
generating a new second clock signal pulse of a new second clock signal during the time window, the new second clock signal pulse having a new second clock signal edge aligned with a first clock signal edge of the first clock signal; and
resetting the counter responsive to the edge of the second clock signal occurring outside of the time window.

18. The method as recited in claim 17 further comprising:
responsive to the edge of the counter occurring after the time window, issuing another new second clock signal pulse during a new window determined, at least in part, by the counter reaching a predetermined count value.

19. The method as recited in claim 17 further comprising resetting the counter responsive to the counter reaching a particular count value.

* * * * *